(12) United States Patent
Kim et al.

(10) Patent No.: US 10,326,057 B2
(45) Date of Patent: Jun. 18, 2019

(54) LIGHT EMITTING DEVICE PACKAGE, METHOD OF MANUFACTURING THE SAME, BACKLIGHT UNIT AND DISPLAY DEVICE INCLUDING THE SAME

(71) Applicant: SAMSUNG ELECTRONICS CO., LTD., Suwon-si, Gyeonggi-do (KR)

(72) Inventors: Tae Hyung Kim, Seoul (KR); Chul Hee Yoo, Yongin-si (KR); Hyun A Kang, Suwon-si (KR); Jung Woo Lee, Hwaseong-si (KR); Jeong Hee Lee, Seongnam-si (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/863,871

(22) Filed: Jan. 6, 2018

(65) Prior Publication Data

US 2018/0198031 A1 Jul. 12, 2018

(30) Foreign Application Priority Data

Jan. 9, 2017 (KR) .................. 10-2017-0003130

(51) Int. Cl.
*H01L 29/18* (2006.01)
*H01L 33/48* (2010.01)
(Continued)

(52) U.S. Cl.
CPC ............ *H01L 33/486* (2013.01); *H01L 33/44* (2013.01); *H01L 33/502* (2013.01);
(Continued)

(58) Field of Classification Search
CPC ... H01L 33/486; H01L 33/502; H01L 33/505; H01L 33/507; H01L 33/54; H01L 33/56; H01L 2933/0041; H01L 2933/005
See application file for complete search history.

(56) References Cited

U.S. PATENT DOCUMENTS 8,847,273 B2  9/2014 Jang et al.
9,447,932 B2  9/2016 An et al.
(Continued)

FOREIGN PATENT DOCUMENTS

| KR | 1020130044072 A | 5/2013 |
|---|---|---|
| KR | 1020150092801 A | 8/2015 |
| KR | 101553045 B1 | 9/2015 |

*Primary Examiner* — Zandra V Smith
*Assistant Examiner* — Andre' C Stevenson
(74) *Attorney, Agent, or Firm* — Cantor Colburn LLP

(57) ABSTRACT

A light emitting device package includes a package frame in which a recessed portion is defined in a center thereof, the package frame including, an interior wall surrounding the recessed portion, a step portion contacting the interior wall and a bottom surface of the recessed portion, a light source disposed inside the recessed portion and emitting first light, a substrate disposed on the light source, and fixed on an upper surface of the step portion and spaced apart from the light source, a light conversion layer disposed on the substrate and including quantum dots that absorbs the first light and emits second light having a different wavelength from the first light, and barrier layer at least covering the light conversion layer, where barrier layer includes a first inorganic barrier layer and a first organic barrier layer.

27 Claims, 15 Drawing Sheets

(51) Int. Cl.
   *H01L 33/50* (2010.01)
   *H01L 33/54* (2010.01)
   *H01L 33/44* (2010.01)
   H01L 33/56 (2010.01)
   H01L 33/60 (2010.01)

(52) U.S. Cl.
   CPC ............ *H01L 33/507* (2013.01); *H01L 33/54* (2013.01); H01L 33/505 (2013.01); H01L 33/56 (2013.01); H01L 33/60 (2013.01); H01L 2933/005 (2013.01); H01L 2933/0025 (2013.01); H01L 2933/0041 (2013.01)

(56) References Cited

U.S. PATENT DOCUMENTS

| | | | |
|---|---|---|---|
| 2005/0072981 A1* | 4/2005 | Suenaga | H01L 33/486 257/88 |
| 2012/0001217 A1 | 1/2012 | Kang et al. | |
| 2012/0313082 A1* | 12/2012 | Jang | H01L 33/44 257/40 |
| 2014/0226308 A1* | 8/2014 | Fukuda | H01L 33/507 362/84 |
| 2014/0284650 A1* | 9/2014 | Jung | H01L 33/58 257/98 |
| 2015/0221834 A1 | 8/2015 | Needham | |
| 2016/0072098 A1* | 3/2016 | Lee | C09K 11/06 257/40 |
| 2016/0104825 A1 | 4/2016 | Sato | |

\* cited by examiner

LIGHT EMITTING DEVICE PACKAGE, METHOD OF MANUFACTURING THE SAME, BACKLIGHT UNIT AND DISPLAY DEVICE INCLUDING THE SAME

CROSS-REFERENCE TO RELATED APPLICATION

This application claims priority to Korean Patent Application No. 10-2017-0003130, filed on Jan. 9, 2017, and all the benefits accruing therefrom under 35 U.S.C. § 119, the content of which in its entirety is herein incorporated by reference.

BACKGROUND

1. Field

A light emitting device package, a method of manufacturing the same, and a backlight unit and a display device including the light emitting device package are disclosed.

2. Description of the Related Art

A material referred to as a semiconductor nanocrystal or quantum dots is a semiconductor material having a nano-sized crystal structure and including several hundred to several thousand atoms.

The quantum dot has a tiny size, so a surface area per a unit volume is large and shows quantum confinement effects, and the like. Thus the quantum dot expresses unique physicochemical characteristics different from instinct characteristics of the semiconductor material itself.

Particularly, characteristics as a nanocrystal photoelectron may be controlled by adjusting a size of the quantum dot or the like, and it has been developed to apply the same for a display device, or bio luminescence display device, or the like.

In addition, the quantum dot having no heavy metal is environmentally-friendly and safe to a human body, so it has various merits as a light emitting material. Many techniques of synthesizing the quantum dots having the excellent characteristics and a variety of applicable possibilities have been developed by adjusting a size, a structure, a uniformity, and the like.

When the quantum dots are applied for a backlight unit or a light emitting device package for a display device, it is desired to improve a stability of quantum dots against oxygen and moisture, a luminous efficiency, a light span of the light emitting device package, and the like.

SUMMARY

An embodiment provides a light emitting device package having improved stability against oxygen and moisture and luminous efficiency.

Another embodiment provides a method of manufacturing the light emitting device package.

Other embodiments provide a backlight unit and a display device including the light emitting device package.

According to an embodiment, a light emitting device package includes a package frame in which a recessed portion is defined in a center thereof, the package frame including an interior wall surrounding the recessed portion, a step portion contacting the interior wall and a bottom surface of the recessed portion, a light source which is disposed inside the recessed portion and emits first light, a substrate disposed on the light source, and fixed on an upper surface of the step portion and spaced apart from the light source, a light conversion layer disposed on the substrate and including a plurality of quantum dots that absorbs the first light and emits second light having a different wavelength from that of the first light, and a plurality of barrier layers at least covering the light conversion layer, where the plurality of barrier layers includes a first inorganic barrier layer and a first organic barrier layer.

In an embodiment, an opening width defined by the step portion is narrower than a width of a length direction of the substrate.

In an embodiment, the substrate partitions the recessed portion into a first region where the light source is positioned and a second region where the light conversion layer is positioned, and a width of the second region is wider than a width of the first region, along the length direction of the substrate.

In an embodiment, along the length direction of the substrate, a width of the light conversion layer may be equal to a width of the first region or wider than the width of the first region.

In an embodiment, along the length direction of the substrate, the width of the first region may be narrower as farther from the substrate.

In an embodiment, along the length direction of the substrate, a width of the second region may be wider as farther from the substrate.

In an embodiment, the step portion may include a first step portion contacting the bottom surface of the recessed portion, and a second step portion disposed on the first step portion.

In an embodiment, a first region may be defined in a center portion of the first step portion and second region may be defined in a center portion of the second step portion, and an opening width of the second region may be wider than an opening width of the first region, along the length direction of the substrate.

In an embodiment, a third region may be further defined on the second region, and an opening width of the third region may be wider than the opening width of the first region and the opening width of the second region, along the length direction of the substrate.

In an embodiment, the first inorganic barrier layer may cover at least a part of a surface of the light conversion layer, and the first inorganic barrier layer may cover a whole of the surface of the light conversion layer.

In an embodiment, the first inorganic barrier layer may cover at least a part of an upper surface of the substrate.

In an embodiment, the first inorganic barrier layer may cover at least a part of the interior wall.

In an embodiment, the first inorganic barrier layer may include a silicon oxide, a silicon nitride, an aluminum oxide, a titanium oxide, an indium oxide, a tin oxide, an indium tin oxide, a tantalum oxide, a zirconium oxide, a niobium oxide, or a combination thereof.

In an embodiment, the first organic barrier layer may include a thiol group (—SH).

In an embodiment, the first organic barrier layer may be disposed on the first inorganic barrier layer.

In an embodiment, the plurality of barrier layers may further include a second inorganic barrier layer covering the first organic barrier layer.

In an embodiment, the second inorganic barrier layer may include a silicon oxide, a silicon nitride, an aluminum oxide, a titanium oxide, an indium oxide, a tin oxide, an indium tin oxide, a tantalum oxide, a zirconium oxide, a niobium oxide, or a combination thereof.

In an embodiment, the plurality of barrier layers may further include a second organic barrier layer covering the second inorganic barrier layer.

In an embodiment, the second organic barrier layer may fill an upper space of the recessed portion partitioned by the substrate.

In an embodiment, the second organic barrier layer may include an epoxy, a vinyl polymer, a polyimide, a polyethylenenaphthalate, a polyethyleneterephthalate, a polyarylate, a polycarbonate, a polyetherimide, a polyethylene, a polyacrylate, a polyethersulfone, or a combination thereof.

In an embodiment, a groove may be defined in an upper surface of the substrate, and the light conversion layer may fill at least the groove.

According to another embodiment, a method of manufacturing a light emitting device package includes preparing a package frame in which a recessed portion is defined in a center thereof, the package frame including an interior wall surrounding the recessed portion, and a step portion contacting the interior wall and a bottom surface of the recessed portion, disposing a light source which emits first light on the bottom surface of the recessed portion, preparing a light conversion layer including a plurality of quantum dots that absorbs the first light and emits second light having a different wavelength from that of the first light, attaching the light conversion layer onto a substrate, fixing the substrate to which the light conversion layer is attached on the step portion so as to make the substrate contact the interior wall and the bottom surface of the recessed portion, forming a first inorganic barrier layer to cover at least a part of the light conversion layer, and forming a first organic barrier layer on the first inorganic barrier layer.

According to the method of manufacturing a light emitting device package, the first inorganic barrier layer may be provided after attaching the light conversion layer onto the substrate.

According to the method of manufacturing a light emitting device package, a second inorganic barrier layer may be provided to cover the first organic barrier layer.

According to the method of manufacturing a light emitting device package, a second organic barrier layer may be provided to cover the second inorganic barrier layer.

According to the method of manufacturing a light emitting device package, a second organic barrier layer may fill an upper space of the recessed portion partitioned by the substrate.

An embodiment provides a backlight unit including the light emitting device package according to an embodiment and a display device including the same.

It may provide a light emitting device package having excellent stability against oxygen and moisture and excellent luminous efficiency, and a method of manufacturing the same.

In addition, it may provide a backlight unit having excellent reliability and luminous efficiency by including the light emitting device package, and a display device expressing an image having high quality.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
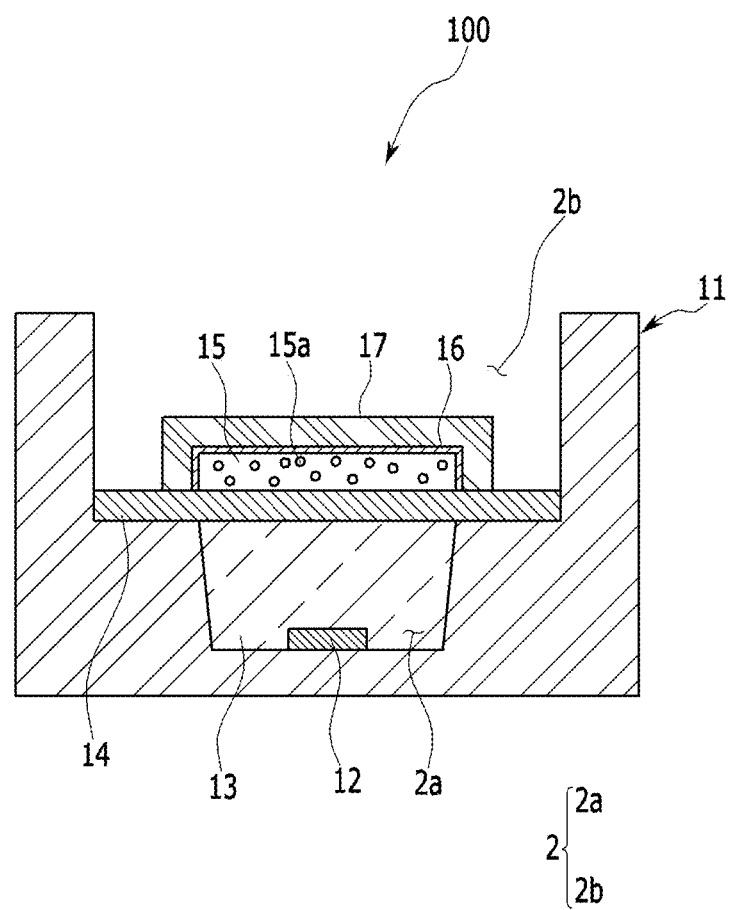
FIG. 1 is a cross-sectional view showing an embodiment of a schematic structure of a light emitting device package.

Embodiments will hereinafter be described in detail, and may be easily performed by those who have common knowledge in the related art. However, this disclosure may be embodied in many different forms and is not construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

First, referring to FIG. 1, a schematic structure of a light emitting device package 100 according to an embodiment is illustrated.

FIG. 1 is a cross-sectional view showing a schematic structure of a light emitting device package according to an embodiment.

The light emitting device package 100 according to an embodiment includes a package frame 11, a light source 12 disposed in the package frame 11, a substrate 14 spaced apart from the light source 12 and disposed above the light source 12, a light conversion layer 15 disposed on the substrate 14 and including a plurality of quantum dots 15a, and a plurality of barrier layers 16 and 17 covering at least the light conversion layer 15. The plurality of barrier layers may include a first inorganic barrier layer 16 covering a surface of the light conversion layer 15 and a first organic barrier layer 17 disposed on the first inorganic barrier layer 16 to further cover the light conversion layer 15.

In the light emitting device package 100 according to an embodiment, the light source 12, the substrate 14, and the light conversion layer 15 are all accommodated in the package frame 11 through a recessed portion 2. In the light emitting device package 100 according to an embodiment, both the substrate 14 and the light conversion layer 15 are spaced apart from the light source 12 defining a predetermined gap.

The light source 12 is disposed on a bottom surface of the package frame 11. According to an embodiment, the light source 12 may include a variety of light emitting units such as a light emitting diode ("LED") chip, a laser, and a lamp.

The light source 12 may emit first light having a predetermined wavelength region. According to an embodiment, the first light may be a blue light having a wavelength region of about 420 nanometers (nm) to about 480 nm, for example, but it is not necessarily limited thereto, and the first light may be in a ultraviolet ("UV") wavelength region or may be a visible light having a different wavelength region from the blue light.

The substrate 14 may include an optically transparent material. In an embodiment, as the substrate 14 is disposed on a light emitting direction of the light source 12, the substrate 14 may pass the light emitted from the light source 12 and transfer the same to the light conversion layer 15.

In an embodiment, the substrate 14 is disposed to define a predetermined gap from the light source 12 and includes a material having excellent blocking properties against moisture and oxygen. In an embodiment, the substrate 14 may include glass, a metal oxide, a polyolefin, a polyester, a polyimide, a polycarbonate, a polyethersulfone, a thiol-ene polymer, a cross-linked or non-cross-linked (meth)acrylate polymer, a melamine(meth)acrylate polymer, polyepoxy, an epoxy(meth)acrylate polymer, an organic silicone polymer, a silicon(meth)acrylate polymer, a polyurethane(meth)acrylate polymer, a vinyl polymer, or a combination thereof, for example.

In an embodiment, the light conversion layer 15 refers to a layer including a light emitting body, which may absorb light entered from the outside, for example, a first light from the light source 12 and convert the first light into a second light having a different wavelength region from the first light, and emit the same. The light conversion layer may include a plurality of quantum dots 15a as a light conversion member.

The light conversion layer 15 is disposed on the substrate 14. The light conversion layer 15 may be disposed on the substrate 14 as shown in FIG. 1, to cover a part of the upper surface of the substrate 14. According to an embodiment, the first inorganic barrier layer 16 may be provided to fully cover all surfaces (upper surface, side surface, and lower surface) of the light conversion layer 15. In other words, the first inorganic barrier layer 16 may be provided to enclose all surfaces of the light conversion layer 15.

The light conversion layer 15 may be provided by coating a resin in which a plurality of quantum dots 15a is dispersed as a light emitting body on a substrate and then curing the same, or injecting a resin in which a plurality of quantum dots 15a is dispersed into a hollow capillary structure and curing the same, and the like.

The quantum dot 15a has a discontinuous energy bandgap by the quantum confinement effect, so it may absorb first light and convert the same to second light having a different wavelength from the first light and may emit the same. Thereby, the light emitting device package 100 including the quantum dot 15a as a light conversion layer may emit light having excellent color reproducibility and color purity.

In an embodiment, a material of the quantum dot 15a is not particularly limited, and known or commercially available quantum dots may be used. In an embodiment, the quantum dot may include a Group II-VI compound, a Group III-V compound, a Group IV-VI compound, a Group IV compound, or a combination thereof, for example.

In an embodiment, the Group II-VI compound may include a binary element compound including CdSe, CdTe, ZnS, ZnSe, ZnTe, ZnO, HgS, HgSe, HgTe, MgSe, MgS, and a combination thereof, a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof, and a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

In an embodiment, the Group III-V compound may include a binary element compound including GaN, GaP, GaAs, GaSb, AlN, AlP, AlAs, AlSb, InN, InP, InAs, InSb, and a combination thereof, a ternary element compound including GaNP, GaNAs, GaNSb, GaPAs, GaPSb, AlNP, AlNAs, AlNSb, AlPAs, AlPSb, InNP, InNAs, InNSb, InPAs, InNSb, InZnP, and a combination thereof, and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof. The Group IV-VI compound may include a binary element compound including SnS, SnSe, SnTe, PbS, PbSe, PbTe, and a combination thereof, a ternary element compound including SnSeS, SnSeTe, SnSTe, PbSeS, PbSeTe, PbSTe, SnPbS, SnPbSe, SnPbTe, and a combination thereof, and a quaternary element compound including SnPbSSe, SnPbSeTe, SnPbSTe, and a combination thereof.

In an embodiment, the Group IV compound may include a single-element compound including Si, Ge, and a combination thereof, and a binary element compound including SiC, SiGe, and a combination thereof.

The binary element compound, the ternary element compound, or the quaternary element compound respectively exist in a uniform concentration in the quantum dot particle or partially different concentrations in the same particle. The quantum dot may have a core-shell structure where one quantum dot 15a surrounds another (different) quantum dot 15a. An element on the interface of the core and shell may have a concentration gradient where the concentration of the element of the shell decreases toward the core. In addition, the quantum dot 15a may have a structure including one quantum dot core and multi-layered shell surrounding the core. The multi-layered shell structure has at least two shell structures where each layer may be a single composition, an alloy, or the one having a concentration gradient.

In addition, the materials of the core of the quantum dot 15a may have a larger energy bandgap than that of the core, and thereby the quantum dot 15a may exhibit a quantum confinement effect more effectively. In case of a multi-layered shell, the bandgap of the material of an outer shell may be higher energy than that of the material of a shell that is closer to the core. In this case, the quantum dot 15a may emit light of a wavelength ranging from UV to infrared light.

In an embodiment, the quantum dot 15a may have quantum efficiency of greater than or equal to about 10 percent (%), for example, greater than or equal to about 30%, greater than or equal to about 50%, greater than or equal to about 60%, greater than or equal to about 70%, or greater than or equal to about 90%.

The plurality of quantum dots 15a may be provided with the same material with each other or may be provided with the different materials from each other. In addition, the plurality of quantum dots 15a may have the same size or different sizes from each other.

In an embodiment, when the incident light is a blue light, a plurality of quantum dots 15a may include a green quantum dot converting at least the blue light to a green light and a red quantum dot converting the blue light to a red light. Thereby, light finally emitted from the light conversion layer 15 according to an embodiment may be controlled to become a white light which is a color combination of blue light, green light, and red light.

However, according to an embodiment, a kind of the light emitting body is not necessarily limited to quantum dots, and also a kind of quantum dot is not limited to the green quantum dot and the red quantum dot.

In an embodiment, the light conversion layer 15 according to an embodiment may emit a white light by combining green quantum dots and a red phosphor or combining red quantum dots and a green phosphor. In addition, it may each include phosphors emitting magenta, cyan, yellow lights, besides the quantum dots.

The first inorganic barrier layer 16 may at least cover all the surfaces of the light conversion layer 15, as described above. The first inorganic barrier layer 16 may play roles of protecting the light conversion layer 15 from physical impacts and simultaneously, protecting the same from extraneous oxygen, moisture, or the like.

The first inorganic barrier layer 16 may include a material having excellent blocking property against oxygen and/or moisture. In an embodiment, the first inorganic barrier layer 16 may be an inorganic material including a silicon oxide, a silicon nitride, an aluminum oxide, a titanium oxide, an indium oxide, a tin oxide, an indium tin oxide, a tantalum oxide, a zirconium oxide, a niobium oxide, or a combination thereof, for example.

In an embodiment, the first inorganic barrier layer 16 may have water vapor transmission rate ("WVTR") and oxygen transmission rate ("OTR") of about $10^{-4}$ grams per square meter per day (g/m2/day) to about $10^{-2}$ g/m$^2$/day, for example, about $10^{-3}$ g/m$^2$/day, for example. As the first inorganic barrier layer 16 has the low water vapor transmission rate and oxygen transmission rate, the first inorganic barrier layer 16 may protect the light conversion layer 15 from oxygen and/or moisture.

The first organic barrier layer 17 may further cover the light conversion layer 15 since the first organic barrier layer 17 is closely contacted with the surface of the first inorganic barrier layer 16 and also disposed on the first inorganic barrier layer 16. The first organic barrier layer 17 may be provided by a solution process of covering an organic material solution on the first inorganic barrier layer 16.

The first organic barrier layer 17 is provided to cover at least the light conversion layer 15 and a region of the first inorganic barrier layer 16 covering the light conversion layer 15. However, an embodiment is not necessarily limited thereto.

The first organic barrier layer 17 according to an embodiment may include a material having improved moisture and oxygen blocking properties. In an embodiment, the first organic barrier layer 17 may be an organic layer including a thiol group (—SH), for example.

In an embodiment, the first organic barrier layer 17 according to an embodiment may include, for example, pentaerythritol tetrakis(3-mercaptopropionate), pentaerythritol tetrakis (3-mercaptobutyrate, trimethylolpropane tris(3-mercaptopropionate) ("3T"), tris [2-(3-mercaptopropinonyloxy)ethyl]isocyanurate ("3TI"), a thiol-ene polymer, or a combination thereof.

The thiol-ene polymer means a polymer of polymerizing a monomer mixture including a first monomer having two or more of thiol groups (—SH) at the terminal end and a second monomer having two or more of carbon-carbon unsaturated bonds at the terminal end.

According to developing an electron industry, as a means for supplying light to a display device or the like, the light emitting device including an LED as the generally-used light source and a phosphor emitting a light in a predetermined wavelength as a light emitting body has been generally used. However, the phosphor has unfavorable color reproducibility and color purity compared to the semiconductor nanocrystal (quantum dot). Thus, applying quantum dots as a material for substituting the phosphor for the light emitting device has been researched.

However, as quantum dots are very weak to oxygen or moisture unlike the other light emitting bodies such as phosphor, it is very important to effectively block the permeation of oxygen or moisture. When the light conversion layer including quantum dots is disposed directly on the light source, for example, it is worried that the light conversion property of quantum dots deteriorates because oxygen or moisture is relatively easily permeated from the light source side to the light conversion layer, for example.

However, in the light emitting device package 100 according to an embodiment, as shown in FIG. 1, the substrate 14 having excellent moisture and oxygen blocking properties is disposed to define a predetermined gap over a light source 12, and the light conversion layer 15 covered with the first inorganic barrier layer 16 and the first organic barrier layer 17 is disposed directly on the substrate 14. Thus the permeating oxygen or moisture from the light source toward the light conversion layer 15 may be effectively blocked by the substrate 14. In addition, as the light conversion layer 15 is protected by being further covered with the first inorganic barrier layer 16 and the first organic barrier layer 17 on both lateral sides and the upper surface thereof, it may stably prevent that oxygen or moisture is directly permeated to the light conversion layer 15.

As described above, the light emitting device package may firstly protect the light conversion layer 15 by the substrate 14 and the first inorganic barrier layer 16, and secondarily protect the light conversion layer 15 by the first organic barrier layer 17 having excellent moisture and oxygen blocking properties. Thus the light conversion layer 15 may have a high reliability.

Hereinafter, the specific package frame structure of the light emitting device package according to an embodiment is more described in detail with references to FIG. 1 together with FIGS. 2 to 5.

Figure 2:
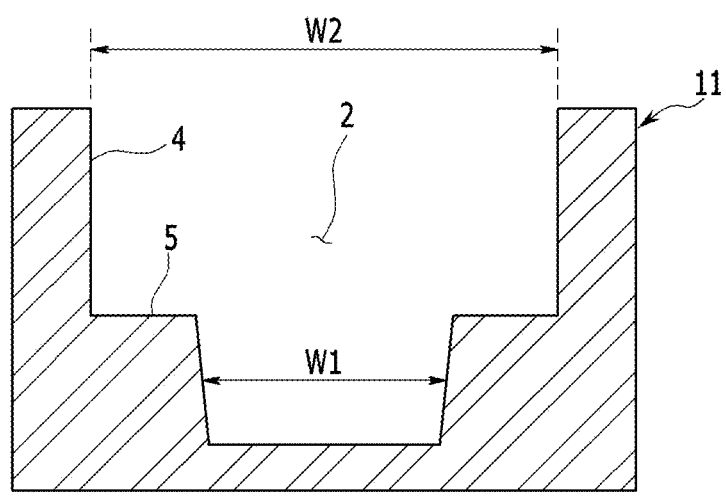
FIGS. 2 to 4 are cross-sectional views showing examples of a variety of package frames of an embodiment of light emitting device packages.

Firstly, referring to FIGS. 1 and 2, a recessed portion 2 is defined in a central part of the package frame 11, and the package frame 11 includes an interior wall 4 surrounding the recessed portion 2. In other words, the package frame 11 may be a hollow structure of which the upper part is opened.

A three-dimensional ("3D") shape of the package frame 11 is not particularly limited. In an embodiment, the overall outer shape of the package frame 11 may be a cylindrical shape, for example, and in this case, the recessed portion 2 may be a space having a cross-sectional surface of a circle or a polygon such as a triangle, a quadrangle, and the like in a top plan view of the package frame 11, for example. In addition, for example, the overall outer shape of the package frame 11 may be a rectangle column shape, in this case, the recessed portion 2 may be a space having a cross-sectional surface of a circle or a polygon such as a triangle, a quadrangle, and the like, in a top plan view of the package frame 11.

In an embodiment, the package frame 11 forms an overall outer shape of the light emitting device package 100. The package frame 11 may include a material having a high light reflectivity. In an embodiment, the package frame 11 may include a metal, a polyolefin, a polyester, a polyimide, a polycarbonate, a polyethersulfone, a polyethyleneterephthalate, a polyethylene, a polyurethane, a polypropylene, an acrylonitrile-butadiene-styrene polymer, a polystyrene, or a combination thereof, for example.

However, the package frame 11 is not necessarily limited to the material, but a light reflective layer including oxide may be disposed on an interior wall of the package frame 11.

The recessed portion 2 may include a first region 2a in which the light source 12 is disposed on the bottom surface of the package frame 11 and a second region 2b which is defined on the first region 2a and in which the light conversion layer 15 is disposed, with the reference to FIG. 1.

The interior wall 4 may be provided with a step having a predetermined height from the bottom surface of the package frame 11, to define a space in a predetermined gap between the substrate 14 and the light source 12. In other words, according to an embodiment, the package frame 11 includes a step portion 5 which contacts the interior wall 4 and the inner bottom surface of the package frame 11 (i.e., bottom surface of the recessed portion 2) and having a step having a predetermined height from the bottom surface of the package frame 11.

An opening is defined in a center portion of the step portion 5 and the step portion 5 is provided to have a predetermined height from the bottom surface of the package frame 11, so the substrate 14 is stably fixed on the upper surface of the step portion 5.

The step portion 5 may have a variety of 3D shapes according to a shape of the package frame 11 and/or a space shape of the recessed portion 2. In an embodiment, in a top plan view of the package frame 11, the center opening of the step portion 5 may have a cross-sectional surface shape of a circle or a polygon, and a step portion 5 may have a cyclic ring shape or a polygonal ring shape, for example.

In an embodiment, the light emitting device package 100 may have a structure that the step portion 5 and the package frame 11 are unitary.

However, an embodiment is not necessarily limited thereto, but the step portion according to an embodiment may be provided by disposing a structure having a circular ring shape or a polygonal ring shape on the bottom surface of the package frame 11 through the recessed portion 2 of the package frame 11.

By forming a step portion 5 having a step from the bottom surface of the package frame 11 as described above, it is easy to dispose the substrate 14 provided with the light conversion layer 15 including quantum dots 15a to define a space from the light source 12.

According to an embodiment, based on the position of the substrate 14 disposed in the package frame 11 as shown in FIG. 1, the space of the recessed portion 2 positioned lower than the substrate 14 is defined as a first region 2a, and the space of the recessed portion 2 positioned upper than the substrate 14 is defined as a second region 2b.

That is, the substrate 14 partitions the recessed portion 2 into the first region 2a and the second region 2b, but the first region 2a means a closed space provided by the step portion 5 and the lower surface of the substrate 14, and the second region 2b means a upside-opened space provided by the upper surface of the substrate 14, both lateral surfaces of the substrate 14, and the interior wall positioned over the step portion 5.

Other spaces except for the light source 12 in the first region 2a may be empty or may be filled with an optically transparent body 13.

Hereinafter, a "width" of one constituent element is designated based on a length direction (e.g., horizontal direction) of the substrate 14 shown in FIG. 1.

First, as a precondition for forming a step portion 5, the width W2 of the second region 2b may be wider than the width W1 of the first region 2a of the first region 2a.

The width W1 of the first region 2a may be decreased as farther from the substrate 14. That is, the width W1 of the first region 2a may be gradually decreased as farther from the space adjacent to the substrate 14 and closer to the bottom surface of the package frame 11. The width W1 of the first region 2a may be linearly decreased as shown in FIG. 2, but an embodiment is not necessarily limited thereto and may be nonlinearly decreased. Thus, the first region 2a may have a 3D shape such as a reversed truncated cone or a reversed frustum of pyramid.

The step portion 5 is provided to satisfy the condition of the width W1 of the first region 2a, so light emitted from the light source 12 is not confined in the first region 2a but is easily guided by a direction toward the substrate 14.

In addition, according to an embodiment, the width W1 of the first region 2a is narrower than the width of the length direction of the substrate 14. Thereby, both terminal ends of the substrate 14 may be safely disposed over the upper surface of the step portion 5 as shown in FIG. 1.

The specific value of the width W1 of the first region 2a may be variously determined depending upon a width of the length direction of the substrate 14, a kind of the light source 12 disposed in the first region 2a, a material of the package frame 11, a light reflectivity of the surface of the step portion 5, and the like.

The width W2 of the second region 2b may be the same value regardless a distance from the substrate 14 as shown in FIG. 2.

Figure 3:
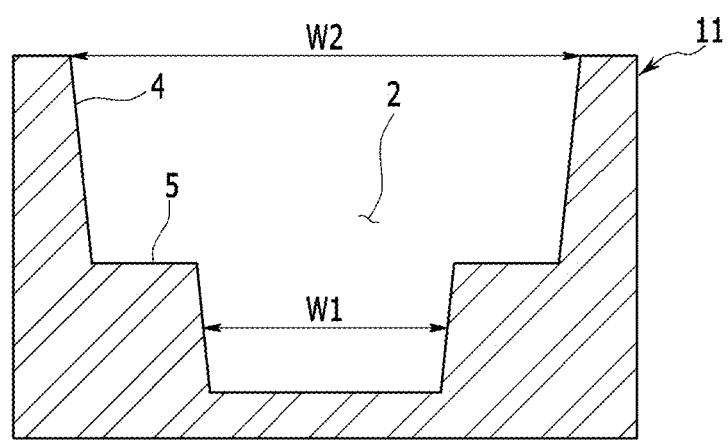

However, an embodiment is not necessarily limited thereto, but may be changed according to a specific shape of the upper interior wall 4 of the step portion 5. In an embodiment, referring to FIG. 3, the width W2 of the second region 2b may be gradually wider as farther from the upper surface of the step portion 5, for example. That is, with reference to FIG. 1, the width W2 of the second region may be gradually increased as farther from the substrate 14. In this case, the width W2 of the second region 2b is linearly increased as shown in FIG. 3, but an embodiment is not necessarily limited thereto and may be nonlinearly increased.

Particularly, the width W2 of the second region 2b may be variously determined depending upon a kind of quantum dot 15a, a wavelength of light converted by the light conversion layer 15, a material of the package frame 11, a light reflectivity of the interior wall 4, and the like.

Figure 4:
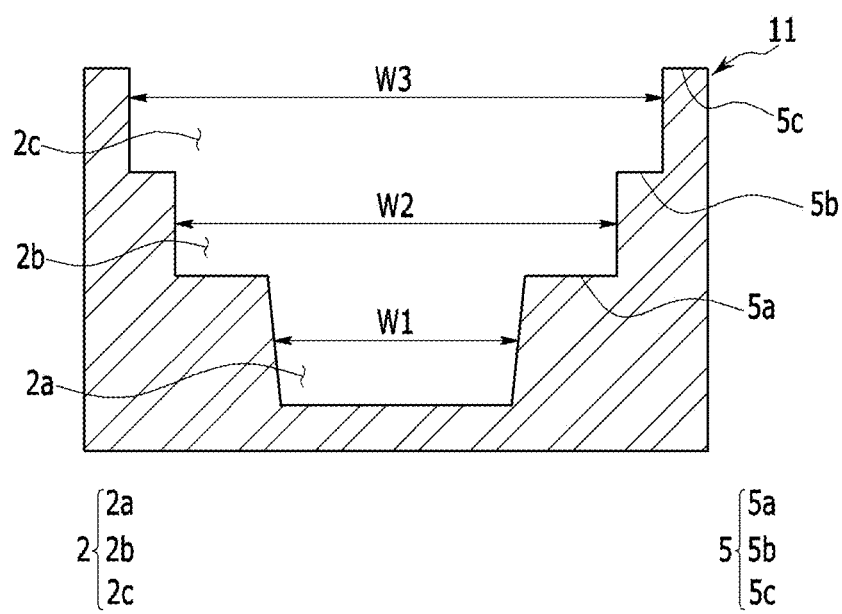

Referring to FIG. 4, the light emitting device package according to an embodiment may include at least two different step portions 5a, 5b, and 5c. More specifically, the step portion 5 may include a first step portion 5a contacting the inner bottom surface of the package frame 11 (i.e., bottom surface of the recessed portion) a second step portion 5b disposed on the first step portion 5a, and a third step portion 5c disposed on the second step portion 5b.

According to an embodiment, the substrate 14 is safely fixed on the upper surface of the first step portion 5a. However, an embodiment is not necessarily limited thereto, but at least two substrates may be positioned at least one of the upper surfaces of the first, the second, and the third step portions 5a, 5b, and 5c.

The thickness of the substrate 14 may be smaller than the step height of the second step portion 5b, but an embodiment is not necessarily limited thereto, and the thickness of the substrate 14 may be greater than or equal to the step height of the second step portion 5b. That is, the thickness of the substrate 14 and each step height of the first, second, third step portions 5a, 5b, and 5c may be variously designed depending upon the relationship with other constituent elements disposed in the package frame 11.

According to an embodiment, all central parts of the first, second, third step portions 5a, 5b, and 5c are opened, but the opening widths may be different from each other.

In an embodiment, the opening width W2 of the second region 2b may be larger than the width W1 of the first region 2a, for example. In addition, the opening width W3 of a third region 2c may be larger than the opening width W1 of the first region 2a and the opening width W2 of the second region 2b.

According to an embodiment, when the step portion 5 includes the different first, second, third step portions 5a, 5b, and 5c different from each other, at least the opening width W2 of a second region 2b is equal to or greater than the length direction width of the substrate 14 (refer to FIG. 1).

In an embodiment, when the substrate is safely fixed on the upper surface of the first step portion 5a, and when the opening width W2 of the second region 2b is equal to the length of the substrate 14, the lower surface of the substrate 14 may be supported by the upper surface of the first step portion 5a, and the both lateral sides of the substrate 14 may be supported by contacting the second step portion 5b. Like this, the lower surface of the substrate 14 is supported by the first step portion 5a, and the both lateral sides of the substrate 14 are further fixed by the second step portion 5b, which may prevent the dislocation of the substrate 14.

Figure 5:
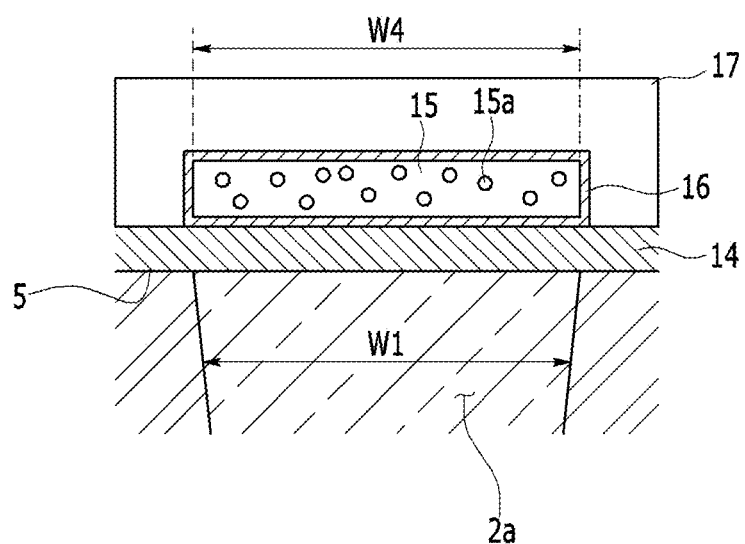
FIG. 5 is an enlarged cross-sectional view of an embodiment of a portion surrounding a light conversion layer of a light emitting device package.

FIG. 5 is an enlarged cross-sectional view of a portion surrounding the light conversion layer of the light emitting device package according to an embodiment.

Referring to FIG. 5, the width W4 of the light conversion layer 15 according to an embodiment may be at least equal to or greater than the width W1 of the first region 2a. Thus the light guided to the substrate 14 from the first region 2a may not be leaked into both lateral sides of the light conversion layer 15 and may be entered into the light conversion layer 15. That is, the relationship between the width W4 of the light conversion layer 15 and the width W1 of the first region 2a is determined as above, so the light conversion efficiency of the light conversion layer 15 may be improved.

Hereinafter, a variety of examples of the light emitting device package applied with the package frame shown in FIG. 2 is further specifically described with reference to FIGS. 6 to 12 in addition to FIG. 1.

FIGS. 6 to 12 are cross-sectional views showing a variety of examples of the light emitting device package applied with the package frame shown in FIG. 2.

The first inorganic barrier layer 16 may further cover a part of the upper surface or the whole upper surface of the substrate 14, or may cover at least a part of the interior wall 4 of the package frame 11, as well as surrounding the surfaces of the light conversion layer 15.

Figure 6:
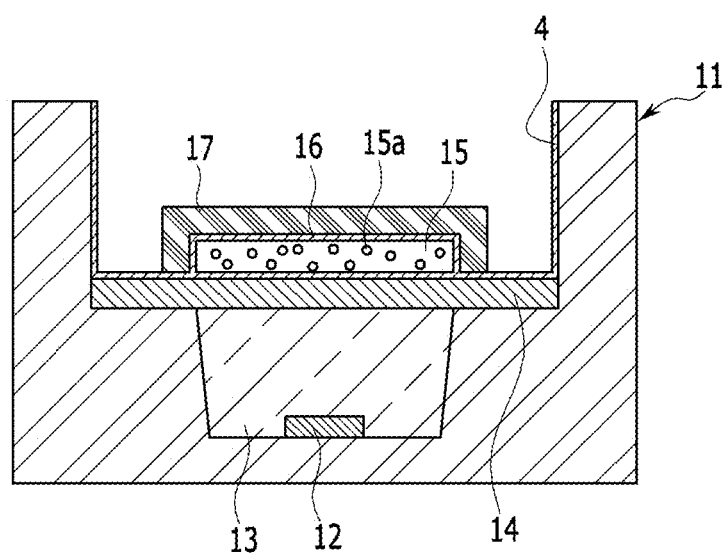
FIGS. 6 to 12 are cross-sectional views showing a variety of examples of the light emitting device package including the package frame shown in FIG. 2.
Figure 7:
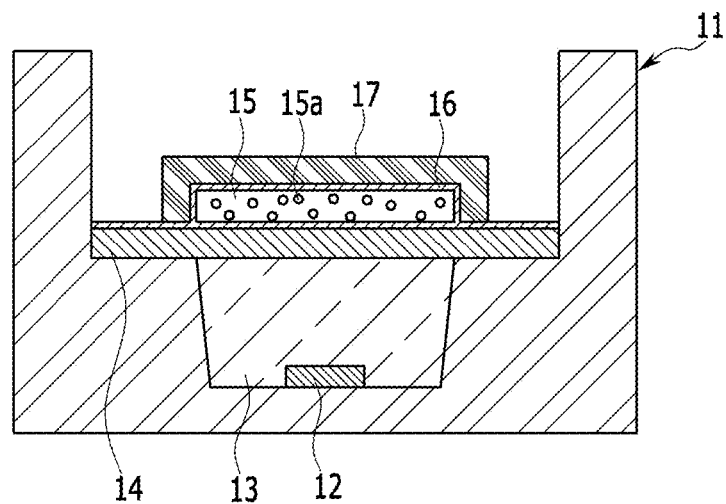
Figure 8:
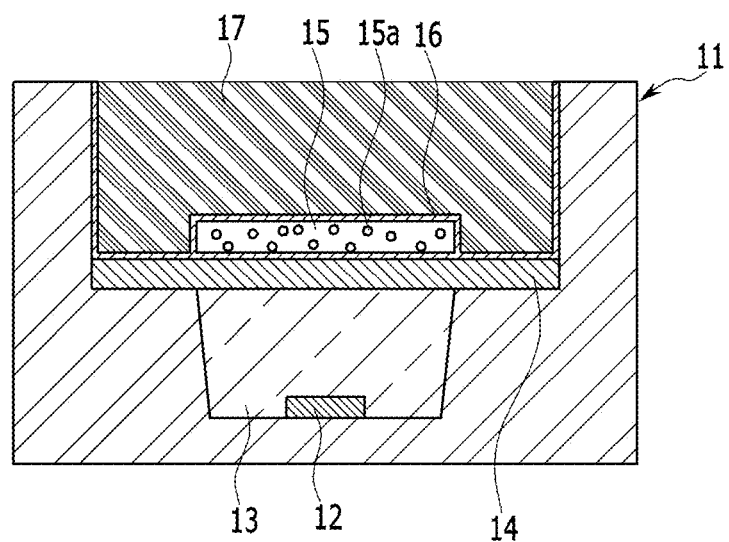

In an exemplary embodiment, the first barrier layer 16 may cover only the surface of the light conversion layer 15, or may further cover a part of the inner wall 4 as well as the surface of the light conversion layer 15 as shown in FIG. 6, or may cover all surfaces of the light conversion layer 15 and the upper surface of the substrate 14 as shown in FIG. 7, for example.

The first inorganic barrier layer 16 is provided and elongated from the surface of the light conversion layer 15 to the substrate 14 and the interior wall 4, so the light conversion layer 15 may be more stably protected from moisture and/or oxygen permeated from the direction of the light source 12 and the substrate 14.

Figure 9:
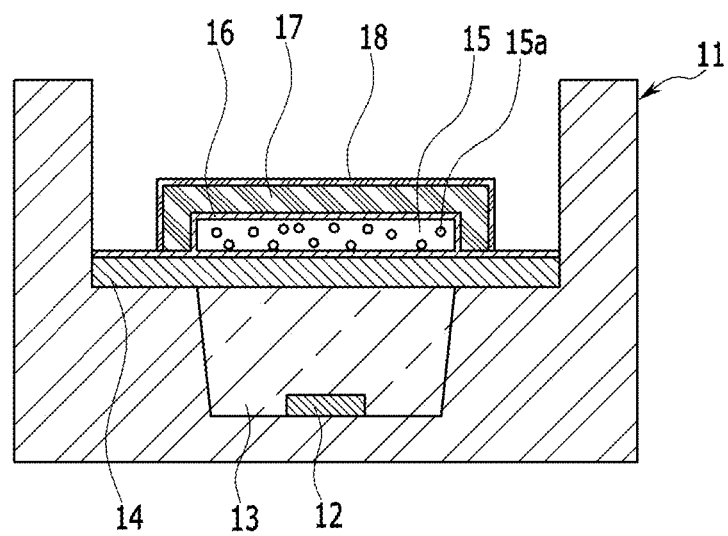

A plurality of barrier layers according to an embodiment may include a second inorganic barrier layer 18 covering the first organic barrier layer 17, as shown in FIG. 9.

The second inorganic barrier layer 18 may block moisture and/or oxygen that are/is passed through the first organic barrier layer 17 and the first inorganic barrier layer 16 and permeated to the light conversion layer 15.

According to an embodiment, the second inorganic barrier layer 18 may include a material having improved moisture and oxygen blocking properties. In an embodiment, the second inorganic barrier layer 18 may be an inorganic material including a silicon oxide, a silicon nitride, an aluminum oxide, a titanium oxide, an indium oxide, a tin oxide, an indium tin oxide, a tantalum oxide, a zirconium oxide, a niobium oxide, or a combination thereof. In an embodiment, the second inorganic barrier layer 18 may have a WVTR and an OTR of about $10^{-4}$ g/m$^2$/day to about $10^{-2}$ g/m$^2$/day, for example, about $10^{-3}$ g/m$^2$/day, for example. As the second inorganic barrier layer 18 has the low water vapor transmission rate and oxygen transmission rate as described above, the second inorganic barrier layer 18 may block the permeation of oxygen and/or moisture into the first organic barrier layer 17.

The second inorganic barrier layer 18 may include an inorganic material which is the same as or different from that of the first inorganic barrier layer 16. A material, a thickness, and the like of the first inorganic barrier layer 16 and the second inorganic barrier layer 18 may be variously determined depending upon a moisture and/or oxygen transmission rate of each the first organic barrier layer 17, the second inorganic barrier layer 18, and the package frame 11, a thickness thereof, and/or an environment of using a light emitting device package, for example.

According to an embodiment, a plurality of barrier layers may further include a second organic barrier layer 19. The second organic barrier layer 19 may be provided by covering an organic material solution on the second inorganic barrier layer 18 according to a solution process.

Figure 10:
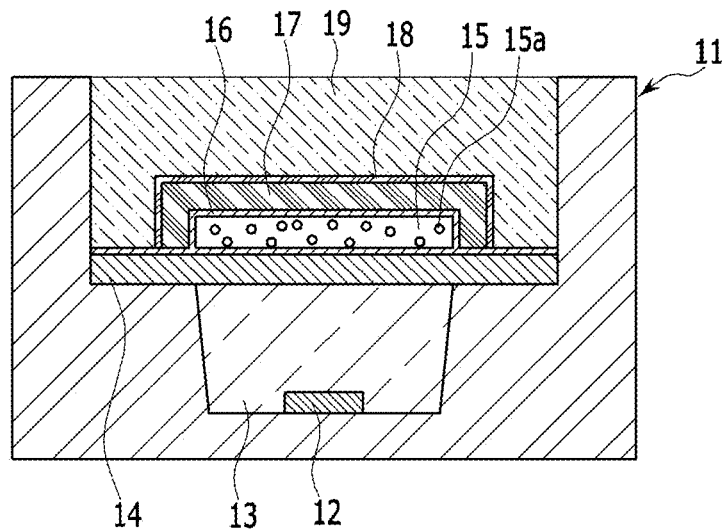
Figure 11:
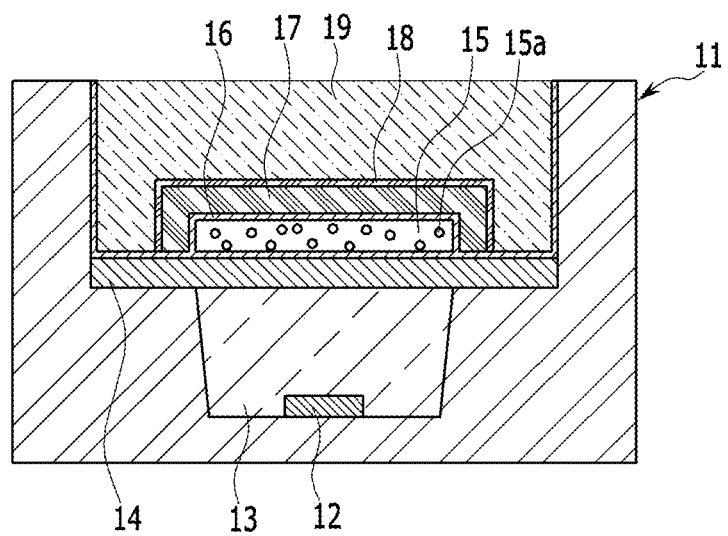

In an exemplary embodiment, the second organic barrier layer 19 may fill the whole upper space of the recessed portion partitioned by the substrate as shown in FIGS. 10 and 11, for example. Thereby, the second organic barrier layer 19 may effectively play a role of blocking the permeation of moisture, oxygen from the outside.

In an embodiment, the second organic barrier layer 19 may be an organic material including a material including, for example, an epoxy, a vinyl polymer, a polyimide, a polyethylenenaphthalate, a polyethyleneterephthalate, a polyarylate, a polycarbonate, a polyetherimide, a polyethylene, a polyacrylate, a polyethersulfone, or a combination thereof.

Like this, the light emitting device package according to an embodiment firstly protects the light conversion layer 15 by the substrate 14, the first inorganic barrier layer 16, and the first organic barrier layer 17, and also it may more effectively block the permeation of moisture, oxygen by the second inorganic barrier layer 18 and the second organic barrier layer 19. Thus the light conversion layer 15 may have a high reliability.

Figure 12:
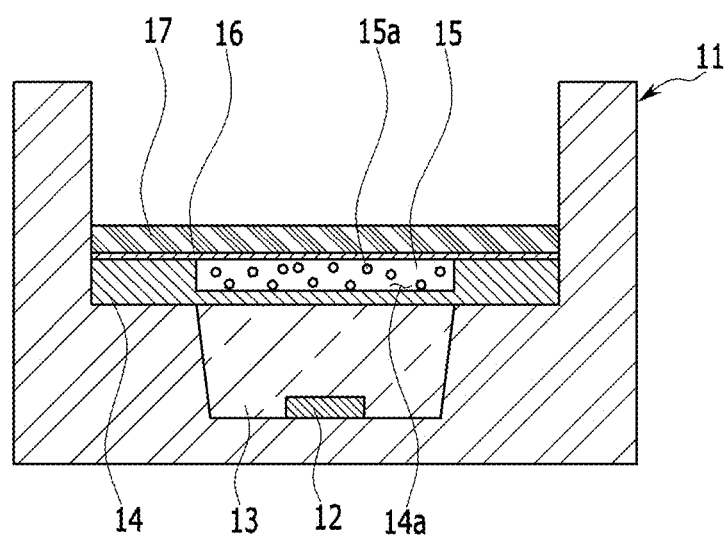

Referring to FIG. 12, a groove 14a is defined in the upper surface of the substrate 14, and the light conversion layer 15 may be filled in at least the groove 14a. When the groove 14a is provided in the light conversion layer 15, it may work as a kind of guide, so that the light conversion layer 15 may be easily disposed on the substrate 14.

The first inorganic barrier layer 16 covers both the upper surface of the substrate 14 and the exposed upper surface of the light conversion layer 15, and the first organic barrier layer 17 is disposed thereon. In the light emitting device package shown in FIG. 12, a step between the upper surface of the light conversion layer 15 and the upper surface of the substrate 14 may be minimized, so it may more easily form the first inorganic barrier layer 16 and the first organic barrier layer 17.

Like this, in the light emitting device package according to an embodiment, the light conversion layer 15, the first inorganic barrier layer 16, and the first organic barrier layer 17 may be easily provided by using the substrate 14 provided with the groove 14a on the upper surface.

Hereinafter, a variety of examples of the light emitting device package including the package frame shown in FIG. 4 is described in detail referring to FIGS. 13 to 15 together with FIG. 1.

Figure 13:
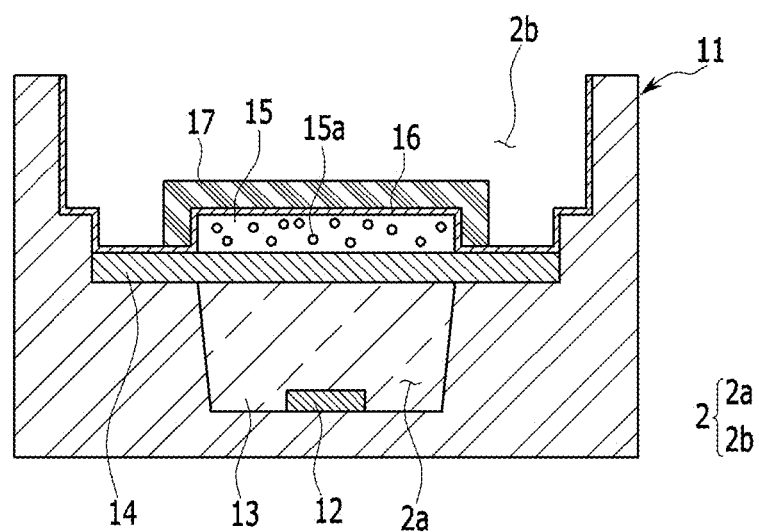
FIGS. 13 to 15 are cross-sectional views showing a variety of examples of the light emitting device package including the package frame shown in FIG. 4.
Figure 14:
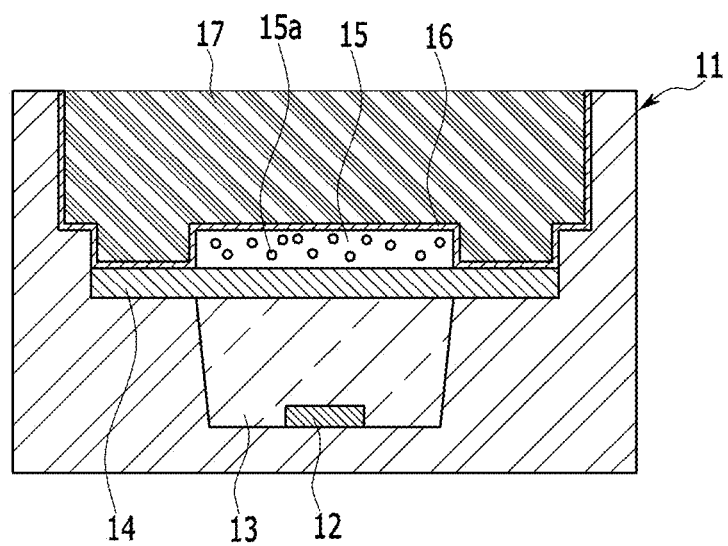
Figure 15:
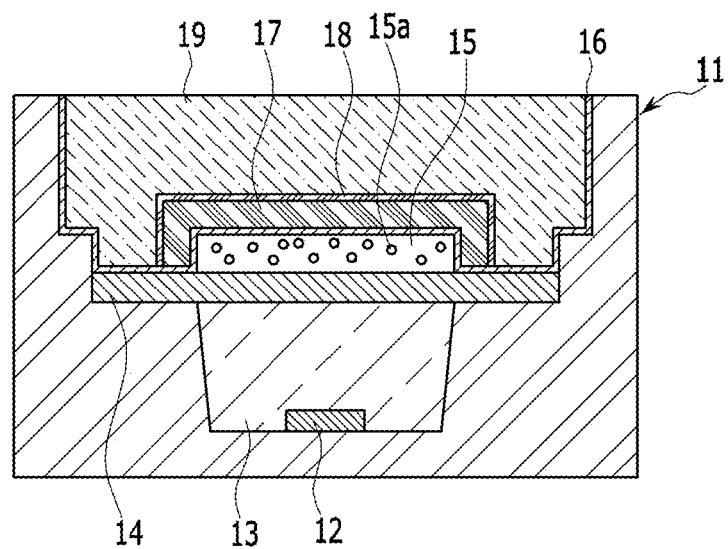

FIGS. 13 to 15 are cross-sectional views showing a variety of examples of the light emitting device package applied with the package frame shown in FIG. 4.

The first inorganic barrier layer 16 may be provided to cover a part of the interior wall 4 (refer to FIG. 2) of the package frame 11 and the upper surface of the substrate 14, besides the light conversion layer 15, as shown in FIG. 13.

The light emitting device package according to an embodiment may fill the whole upper space of the recessed portion partitioned by the substrate 14 as shown in FIG. 14. That is, the first organic barrier layer 17 may fill the whole of the opening of the second region 2b and the opening of the third region 2C (refer to FIG. 4).

In the light emitting device package according to an embodiment, a second organic barrier layer 19 may fill the whole upper space of the recessed portion partitioned by the substrate 14, and a second inorganic barrier layer 18 may be interposed between the first organic barrier layer 17 and the second organic barrier layer 19.

Like this, even in the light emitting device package applied with the package frame shown in FIG. 4, it may provide a light emitting device package with a high reliability and a high luminous efficiency by variously applying the second inorganic barrier layer 18 and/or the second organic barrier layer 19 or by applying the various structures of the first inorganic barrier layer 16 surrounding the surface of the light conversion layer 15 using a variety of materials, structures and the like.

Hereinafter, a method of manufacturing the light emitting device package will be described.

In a method of manufacturing a light emitting device package according to an embodiment, first, a package frame including a recessed portion in the center and an interior wall surrounding the recessed portion is prepared. The package frame may have at least one step portion, as shown in FIG. 2 or FIG. 4.

Then a light source is disposed on the bottom surface of the package frame through the recessed portion of the prepared package frame, and the opening defined in the center of the step portion is all filled with a transparent resin, for the step portion contacting the bottom surface of the package frame. However, an embodiment is not necessarily limited thereto, but the filling the opening with the transparent resin may be omitted.

Then, a first inorganic barrier layer may be provided on an interior wall of the package frame, an upper surface of the step portion, and an upper surface of the transparent resin by a sputtering, a chemical vapor deposition ("CVD"), or a solution process of covering an inorganic material solution including silicon oxide, silicon nitride or the like on the substrate, and the like. However, an embodiment is not necessarily limited thereto, and the process of forming a first inorganic barrier layer in the package frame may be omitted.

Separately, a light conversion layer is prepared. According to an embodiment, the light conversion layer may be provided by a method of coating a light emitting resin including a plurality of quantum dots on a substrate having a low oxygen and/or moisture transmission rate and curing the same, and the like. The light conversion layer may have a variety of shapes according to a shape of the substrate, but according to an embodiment, it may have a film shape shown in FIG. 1 as it is provided on the flat upper surface of the substrate. However, an embodiment is not necessarily limited thereto, but as shown in FIG. 12, a substrate provided with groove in the upper surface is prepared, and a light emitting resin including quantum dots is coated in the grooves and cured to provide a light conversion layer.

Then the substrate-light conversion layer laminate is safely fixed on the step portion in the package frame. In this case, the lower surface of the substrate is supported by the upper surface of the step portion, and the both lateral sides of the substrate may be fixed by contacting the interior wall or the step portion.

Before disposing the substrate-light conversion layer laminate, an adhesive layer is provided on the upper surface of the step portion and/or the interior wall in order to more safely fix the laminate.

Then a first inorganic barrier layer is provided to cover the exposed surface of the light conversion layer. The first inorganic barrier layer may be provided by a sputtering, a CVD, or a solution process of covering an inorganic material solution including silicon oxide, silicon nitride on the substrate, and the like.

Then a first organic barrier layer is provided by a solution process of covering an organic material solution on the first inorganic barrier layer to cover at least the light conversion layer. In an exemplary embodiment, the first organic barrier layer is an organic layer including a thiol group (—SH), which has excellent moisture and oxygen blocking properties.

The first organic barrier layer may be provided to fill a part of the upper region of the recessed portion partitioned by the substrate or may be provided to fill whole region.

Then a second in organic barrier layer is provided by a sputtering, a CVD, or a solution process of positioning an inorganic material solution including silicon oxide, silicon nitride and the like on the substrate to provide a second inorganic barrier layer. The second inorganic barrier layer may block the transferring moisture and/or oxygen to the first organic barrier layer. The second inorganic barrier layer may be provided by the same material and/or method as in the first inorganic barrier layer, but it may be provided by the different material and/or method.

Then a second organic barrier layer may be provided to fill the whole upper region of the recessed portion partitioned by the substrate according to a solution process of covering an organic solution. The second organic barrier layer may be disposed on the outermost, viewing from the light conversion layer, and may play a role of primarily blocking moisture and/or oxygen permeated from the outside.

By a method of manufacturing a light emitting device package according to an embodiment, it may easily provide a light emitting device package with both excellent stability against oxygen and/or moisture and excellent light emitting efficiency. The obtained light emitting device package may further include a second inorganic barrier layer and a second organic barrier layer, besides the substrate having excellent moisture and/or oxygen blocking properties, the first inorganic barrier layer, and the first organic barrier layer. Thus although the light emitting device package according to an embodiment includes quantum dots as a light emitting body, it has excellent blocking performance against moisture and/or oxygen. That is, according to an embodiment, it may provide a light emitting device package with both excellent reliability and excellent luminous efficiency.

According to an embodiment, a backlight unit including the light emitting device package is provided. The backlight unit according to an embodiment may include the light emitting device package, a light guide guiding a path of light emitted from the light emitting device package, and a reflector reflecting a part of the emitted light and returning the same to the light guide. The backlight unit according to an embodiment may be an "edge type" backlight unit in which the light emitting device package is disposed on the side of the reflector and the light guide or a "direct type" backlight unit in which the light emitting device package is disposed on the rear side of the light guide.

According to an embodiment, it may provide a display device including a backlight unit including the light emitting device package. The display device may be, for example, a liquid crystal display ("LCD"), but is not necessarily limited thereto, and it may be a various kinds of the display devices requiring the backlight unit.

As the backlight unit according to an embodiment includes a light emitting device package having both excellent blocking performance against oxygen and/or moisture and excellent luminous efficiency, the obtained light source may have both excellent reliability and excellent luminous efficiency. In addition, the display device according to an embodiment includes the backlight unit, so as to express an image having high quality.

Hereinafter, the embodiments are illustrated in more detail with reference to examples. These examples, however, are not in any sense to be interpreted as limiting the scope of the invention.

EXAMPLE 1

A package frame structure including epoxy molding compound ("EMC") and having a width, depth, and height of about 8.0 millimeter (mm)×3.6 mm×2.47 mm is prepared. A recessed portion is provided in the package frame. A step portion is protruded from each the bottom surface and the inner surface in the package frame, and the protruded height is 0.5 mm from the bottom surface. The central part of the step portion is opened, and the opening of the step portion has a cross-sectional surface of rectangle, in a top plan view of the package frame.

The opening width of the step portion is at maximum 6 mm, and the opening width of the step portion is narrower as going from the upper surface of the step portion to the bottom surface. That is, the opening of the step portion may have a reversed frustum of pyramid shape.

A light source of a blue LED is disposed and fixed on the bottom surface, and the opened space of the step portion is filled with an optically transparent silicone resin (manufactured by Dow corning, EG6301 A).

Separately, a light emitting resin in which 0.12 gram (g) of green quantum dots, 0.03 g of red quantum dots, and 1 g of optically transparent silicone resin (manufactured by Dow corning, EG6301 A) are mixed is coated on a glass plate having a thickness of 0.3 mm and a width of 5.5 mm to provide a width of 3.5 mm, and then is cured at 150 degrees Celsius (° C.) for 1 hour, to provide a light emitting film including green quantum dots and red quantum dots on the glass plate.

The provided light emitting film is delaminated from the glass plate and attached onto a substrate. Then, the substrate-light emitting film laminate is fixed on the upper surface of the step portion. In this case, the light emitting film is disposed to be on the substrate. Thus, the light emitting film is disposed to define a gap of about 1.2 mm from the light source.

Then the package frame having a substrate-light emitting film laminate is positioned in a vacuum chamber and is sputtered using the silicon dioxide target (manufactured by TASCO) for 30 minutes at 400 W, so the exposed surface of the cured light emitting film is provided with a first silicon dioxide having a thickness of 200 nm.

Separately, a composition for a first organic barrier layer in which pentaerythritol tetrakis (3-mercaptopropionate) and 1,3,5-triallyl-1,3,5-triazine-2,4,6 1H, 3H, and 5H-trione are mixed is prepared. The prepared composition for the first organic barrier layer is coated on the region covering the light emitting film in the first silicon dioxide layer in a thickness of 100 μm and cured by irradiating UV to provide a first organic barrier layer further covering the light emitting film where is covered with the first silicone dioxide layer.

Then the package frame provided with the first organic barrier layer is positioned in the vacuum chamber and sputtered using a silicon dioxide target (manufactured by TASCO) for 30 minutes at 400 watts (W) to provide a second silicone dioxide layer in a thickness of 200 nm on the surface of the first organic barrier layer, the surface of the substrate, and the interior wall of the package frame.

Then a composition for a second organic barrier layer including an epoxy resin (manufactured by Daicel) is coated to fill the remained whole of the recessed portion of the package frame, and then cured by irradiating UV to provide a structure according to Example 1 including the second organic barrier layer filling the other inner space of the package frame. The structure according to Example 1 includes all of the light source and the substrate-light emitting film laminate in the package frame, and the width of the light emitting film is wider than the width of the opening of the step portion.

EXAMPLE 2

Instead of providing the second silicon dioxide layer and the second organic barrier layer as in Example 1, the composition for the first organic barrier layer is coated to fill the whole of the recessed portion of the package frame, and then cured by irradiating UV to provide a structure according to Example 2 in which the substrate-light emitting film-first silicon dioxide layer laminate is fixed on the step portion of the package frame, and the first organic barrier layer is filled in the other inner space. The structure according to Example 2 also includes all of the light source and the substrate-light emitting film laminate in the package frame, and the width of the light emitting film is wider than the opening width of the step portion.

COMPARATIVE EXAMPLE 1

An LED package (Samsung Electron, SFL70) including a reflector layer coated with a reflective layer is prepared. The reflector layer is opened in the central part thereof, and the central opening of the reflector layer has a width of 7.0 mm.

Then the opened space of the step portion is filled with an optically transparent silicone resin (manufactured by Dow corning, EG6301 A) to provide an LED package. Separately, a glass substrate provided with a recessed portion having a depth of 0.5 mm and a width of 5.6 mm is prepared, and all the space of the recessed portion is filled with the same light emitting resin as in Example 1 and cured at 150° C. for 1 hour to provide a light emitting film including green quantum dots and red quantum dots in the recessed portion of the substrate.

Then the substrate-light emitting film laminate is disposed in the vacuum chamber and sputtered using a silicon dioxide target (manufactured by TASCO) for 30 minutes at 400 W to provide a silicon dioxide layer having a thickness of 200 nm on the exposed surface of the light conversion layer and the upper surface.

Then the substrate-light emitting film-silicon dioxide layer laminate is disposed on the LED package, so as to provide a structure according to Comparative Example 1 in which the LED package including a light source is disposed inside thereof, and the substrate-light emitting film-silicon dioxide layer laminate is disposed outside of the LED package. According to Comparative Example 1, the central opening width of the reflector layer is wider than the width of the light emitting film.

Evaluation 1: Light Efficiency of Example 1 and Comparative Example 1

Then each structure of Example 1 and Comparative Example 1 is measured for a luminance at a point corresponding to a color coordinate of CIE_X: 0.28, CIE_Y: 0.25 for four times, and the results are shown in Table 1.

TABLE 1

|  | Number of times | Luminance (lm) @ 0.28 and 0.25 |
| --- | --- | --- |
| Example 1 | 1 | 72.0 |
|  | 2 | 74.5 |
|  | 3 | 72.6 |
|  | 4 | 74.6 |
| Comparative Example 1 | 1 | 65.9 |
|  | 2 | 67.7 |
|  | 3 | 66.1 |
|  | 4 | 66.7 |

Referring to Table 1, it is confirmed that all cases of Example 1 show higher luminance than those of Comparative Example 1. This is understood that the light intensity actually entered from the light source into the light emitting film may be different even though the same light sources are used in both structures according to Example 1 and Comparative Example 1, and the both substrates are spaced apart from the light sources in a predetermined gap.

That is, as the light emitting film has wider width than the width of the opening part of the step portion and is disposed in the package in the case of Example 1, the light emitted from the light source is not leaked and is entered into the light emitting film, so as to provide a high light efficiency. In a case of Comparative Example 1, the width of the central opening part of the reflector layer is wider than the width of the light emitting film, and the light emitting film is disposed outside of the package, so it is estimated that the lost amount of light which is emitted from the light source and is not absorbed by the light emitting film is relatively high.

Evaluation 2: Stability Against Moisture of Examples 1 and 2

The structures according to Examples 1 and 2 are positioned each in a chamber maintaining a condition at a temperature of 60° C. and a relative humidity of 30% and a chamber maintaining a condition of a temperature of 60° C. and a relative humidity of 90%, and then the changes of "stability against moisture" of the structures of Examples 1 and 2 depending upon a time are measured, and the results are shown in Table 2.

The term "stability against moisture" in an embodiment refers to the percentage results of a luminance measured by a spectroscopy in a predetermined time interval to the initial measured value.

TABLE 2

| | | Times | | | | | |
|---|---|---|---|---|---|---|---|
| Condition | | 1 hour | 3 hours | 18 hours | 24 hours | 168 hours | 312 hours |
| Example 1 | Temperature 60° C. Relative humidity 30% | 100% | 100% | 100% | 98% | 96% | 95% |
| | Temperature 60° C. Relative humidity 90% | 100% | 100% | 100% | 99% | 92% | 92% |
| Example 2 | Temperature 60° C. Relative humidity 30% | 100% | 100% | 100% | 97% | 92% | — |
| | Temperature 60° C. Relative humidity 90% | 100% | 100% | 100% | 94% | 89% | — |

Referring to Table 2, it is confirmed that both Example 1 and Example 2 have very excellent performances of blocking moisture until passing 18 hours, particularly, in a case of Example 1, the stability is deteriorated only about 5% even when passing 312 hours under the condition at a relative humidity of 30%, and the stability is deteriorated only about 8% even when passing 312 hours under the condition at a relative humidity of 90%. In a case of Example 2, the stability is deteriorated in about 3% when passing 24 hours under the condition at a relative humidity of 30%, and the stability is deteriorated in about 8% when passing 168 hours. In addition, in Example 2, the stability is deteriorated in about 6% by passing 24 hours under the condition at a relative humidity of 90%, and the stability is deteriorated in about 11% when passing 168 hours.

Although both the conditions of a temperature of 60° C. and a relative humidity of 30% and the conditions of a temperature of 60° C. and a relative humidity of 90% are severer conditions than the conditions of generally using the light emitting device package, the backlight unit, and the display device, it is confirmed that all of Example 1 and Example 2 show a high stability even under the severe conditions of a temperature and a humidity.

In addition, it is confirmed that the structure according to Example 1 in which the light conversion layer is protected by alternatively disposing an inorganic layer and an organic layer, for example, a first silicon dioxide layer-first organic barrier layer-second silicon dioxide layer-third organic barrier layer is more favorable under a high humid condition than the structure according to Example 2 in which the light emitting film is protected only by the first silicon dioxide layer and the first organic barrier layer including a thiol group.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A light emitting device package, comprising:
    a package frame in which a recessed portion is defined in a center thereof, the package frame including:
    an interior wall surrounding the recessed portion,
    a step portion contacting the interior wall and a bottom surface of the recessed portion;
    a light source which is disposed inside the recessed portion and emits first light;
    a substrate disposed on the light source, and disposed on an upper surface of the step portion and spaced apart from the light source;
    a light conversion layer disposed on the substrate and including a plurality of quantum dots which absorbs the first light and emits second light having a different wavelength from that of the first light; and
    a plurality of barrier layers at least covering the light conversion layer,
    wherein the plurality of barrier layers includes a first inorganic barrier layer and a first organic barrier layer, and
    the first inorganic barrier layer contacts the light conversion layer.

2. The light emitting device package of claim 1, wherein an opening width defined by the step portion is narrower than a length direction width of the substrate.

3. The light emitting device package of claim 1, wherein the substrate partitions the recessed portion into a first region where the light source is disposed and a second region where the light conversion layer is disposed, and
    the second region has a wider width than a width of the first region, along a length direction of the substrate.

4. The light emitting device package of claim 3, wherein the width of the light conversion layer is equal to the width of the first region or wider than the width of the first region, along the length direction of the substrate.

5. The light emitting device package of claim 3, wherein the width of the first region is gradually decreased as farther from the substrate, along the length direction of the substrate.

6. The light emitting device package of claim 3, wherein the width of the second region is gradually increased as farther from the substrate, along the length direction of the substrate.

7. The light emitting device package of claim 1, wherein the step portion comprises:
    a first step portion contacting the bottom surface of the recessed portion and
    a second step portion disposed on the first step portion.

8. The light emitting device package of claim 7, wherein a first region is defined in a center portion of the first step portion and a second region is defined in a center portion of the second step portion, and
    an opening width of the second region is wider than an opening width of the first region, along a length direction of the substrate.

9. The light emitting device package of claim 8, wherein the opening width in the second region is equal to or wider than the length of the substrate, along the length direction of the substrate.

10. The light emitting device package of claim 8, wherein a third region is further defined on the second region, and
    wherein an opening width of the third region is wider than the opening width of the first region and the opening width of the second region, along the length direction of the substrate.

11. The light emitting device package of claim 1, wherein the first inorganic barrier layer covers at least a part of a surface of the light conversion layer.

12. The light emitting device package of claim 11, wherein the first inorganic barrier layer is provided to cover a whole of the surface of the light conversion layer.

13. The light emitting device package of claim 1, wherein the first inorganic barrier layer covers at least a part of an upper surface of the substrate.

14. The light emitting device package of claim 1, wherein the first inorganic barrier layer covers at least a part of the interior wall.

15. The light emitting device package of claim 1, wherein the first inorganic barrier layer includes a silicon oxide, a silicon nitride, an aluminum oxide, a titanium oxide, an indium oxide, a tin oxide, an indium tin oxide, a tantalum oxide, a zirconium oxide, a niobium oxide, or a combination thereof.

16. The light emitting device package of claim 1, wherein the first organic barrier layer includes a thiol group (—SH).

17. The light emitting device package of claim 1, wherein the first organic barrier layer is disposed on the first inorganic barrier layer.

18. The light emitting device package of claim 17, wherein the plurality of barrier layers further comprises a second inorganic barrier layer covering the first organic barrier layer.

19. The light emitting device package of claim 18, wherein the second inorganic barrier layer includes a silicon oxide, a silicon nitride, an aluminum oxide, a titanium oxide, an indium oxide, a tin oxide, an indium tin oxide, a tantalum oxide, a zirconium oxide, a niobium oxide, or a combination thereof.

20. The light emitting device package of claim 18, wherein the plurality of barrier layers further comprises a second organic barrier layer covering the second inorganic barrier layer.

21. The light emitting device package of claim 20, wherein the second organic barrier layer fills an upper space of the recessed portion partitioned by the substrate.

22. The light emitting device package of claim 20, wherein the second organic barrier layer includes an epoxy, a vinyl polymer, a polyimide, a polyethylenenaphthalate, a polyethyleneterephthalate, a polyarylate, a polycarbonate, a polyetherimide, a polyethylene, a polyacrylate, a polyethersulfone, or a combination thereof.

23. The light emitting device package of claim 1, wherein an upper surface of the substrate is provided with a groove, and the light conversion layer fills at least the groove.

24. A backlight unit comprising the light emitting device package of claim 1.

25. A display device comprising the backlight unit of claim 24.

26. A light emitting device package, comprising:
a package frame including an interior wall defining a recessed portion, the interior wall including a bottom surface and a step extending from the bottom surface;
a light source which is disposed on the bottom surface and emits light;
a substrate disposed on the step and spaced apart from the light source;
a light conversion layer disposed on the substrate and including a plurality of quantum dots which absorbs the first light and emits second light having a different wavelength from that of the first light; and
a first barrier layer which includes inorganic material and covers at least a surface of the light conversion layer;
a second barrier layer which includes organic material is disposed on the inorganic barrier layer; and
a third barrier layer which is disposed between the substrate and the light conversion layer.

27. The light emitting device package of claim 26, wherein third barrier layer includes inorganic material.

* * * * *